United States Patent [19]

Roman et al.

[11] Patent Number: 5,378,659

[45] Date of Patent: Jan. 3, 1995

[54] METHOD AND STRUCTURE FOR FORMING AN INTEGRATED CIRCUIT PATTERN ON A SEMICONDUCTOR SUBSTRATE

[75] Inventors: Bernard J. Roman; Bich-Yen Nguyen; Chandrasekaram Ramiah, all of Austin, Tex.

[73] Assignee: Motorola Inc., Schaumburg, Ill.

[21] Appl. No.: 86,268

[22] Filed: Jul. 6, 1993

[51] Int. Cl.[6] ............................................. H01L 21/31
[52] U.S. Cl. ................... 437/229; 437/228; 437/241; 156/659.1; 156/653
[58] Field of Search ........................ 437/228, 229, 241; 156/659.1, 653

[56] References Cited

U.S. PATENT DOCUMENTS

| 5,066,615 | 11/1991 | Brady et al. | 437/229 |
| 5,126,289 | 6/1992 | Ziger | 437/231 |
| 5,135,877 | 8/1992 | Albergo et al. | 437/23 |

FOREIGN PATENT DOCUMENTS

61-290721 12/1986 Japan .................................. 437/229

OTHER PUBLICATIONS

Cynthia Zee et al., "Effect of Developer Type and agitation on Dissolution of Positve Photoresist." SPIE vol. 920 Advances in Resist Technology and Processing V, 1988, pp. 154–161.

Tohru Ogawa et al., "Practical resolution enhancement effect by new complete anti-reflective laeyr in KrF laser lithography." SPIE vol. 1927 Optical/Laser Microlithography VI, 1993, pp. 263–274.

C. Nolscher et al., "High contrast single layer resists and antireflecion layers-an alternative to multilayer resist techniques," SPIE vol. 1086 Advances in Resist Technology and Processing VI, 1989, pp. 242–250.

B. Dudley et al., "Enhancement of deep UV patterning integrity and process control using anti-reflective coating," SPIE vol. 1672 Advances in resist technology and processing IX, 1992, pp. 638–646.

Yurika Suda et al., "A new anti-reflective layer for deep UV lithography," SPIE vol. 1674 Optical/Laser Microlithography V, 1992, pp. 350–361.

Tohru Ogawa et al., "Novel ARC optimization Methodology for KrF excimer laser lithography at low K1 factor," SPIE vol. 1674 Optical/Laser Microlithography V, 1992, pp. 362–375.

Z. Chen et al., "A novel and effective PECVD SiO2/SiN antireflection coating for Si Solar cells," IEEE Transactions on Electron Devices, vol. 40, No. 6, Jun. 1993, pp. 1161–1165.

C. C. Johnson et al., "Plasma-enhanced CVD silicon nitride antireflection coatings for solar cells," Solar Energy, vol. 31, No. 4, 1983, pp. 355–358.

*Primary Examiner*—T. N. Quach
*Attorney, Agent, or Firm*—Kent J. Cooper

[57] ABSTRACT

Reflective notching of a photoresist pattern (20), generated over reflective materials on a semiconductor substrate (12), is minimized by using an anti-reflective layer (20) of silicon-rich silicon nitride. The layer of silicon-rich silicon nitride is formed over the reflective materials and a layer of photoresist is then formed over the silicon-rich silicon nitride. The photoresist layer is then photolithographically patterned to form an integrated circuit pattern (20). The silicon-rich silicon nitride layer has an absorptive index of greater than 0.25, which allows it to be used as an anti-reflective layer with photolithographic patterning systems having ultraviolet and deep ultraviolet exposure wavelengths.

34 Claims, 2 Drawing Sheets

METHOD AND STRUCTURE FOR FORMING AN INTEGRATED CIRCUIT PATTERN ON A SEMICONDUCTOR SUBSTRATE

FIELD OF THE INVENTION

This invention relates generally to semiconductor devices, and more generally to a process for forming an integrated circuit pattern on a semiconductor substrate.

BACKGROUND OF THE INVENTION

The semiconductor industry's continuing drive toward integrated circuits with ever decreasing geometries, coupled with its pervasive use of highly reflective materials, such as polysilicon, aluminum, and metal silicides, has led to increased photolithographic patterning problems. Unwanted reflections from these underlying materials, during the photoresist patterning process, cause the resulting photoresist patterns to be distorted. This problem is further compounded when photolithographic imaging tools having ultraviolet (UV) and deep ultraviolet (DUV) exposure wavelengths are used to generate the photoresist patterns. Although shorter imaging wavelengths bring improved resolution by minimizing diffraction limitations, the resulting patterns generated in the photoresist are easily compromised by the effects of uncontrolled reflections from underlying materials due to the increased optical metallic nature of underlying reflective materials at these wavelengths. Moreover, photoresist patterns are particularly degraded in areas where the topology of the underlying reflective material changes. In these stepped areas the reflection intensity from underlying materials is often enhanced and results in "reflective notciting" or a locally distorted photoresist pattern near the stepped areas. Therefore, the formation of submicron photoresist patterns over semiconductor substrates is difficult to achieve, and as a result, fabrication of advanced integrated circuits with submicron geometries is limited.

Accordingly, a need exists for a method that forms submicron integrated circuit patterns in a photoresist layer which overlies the varying topography and highly reflective materials found on semiconductor substrates.

SUMMARY OF THE INVENTION

The previously mentioned problems with existing methods for forming an integrated circuit pattern on a semiconductor substrate are overcome by the present invention. In one embodiment of the invention, a semiconductor substrate is provided. A device layer is then formed overlying the major surface of the semiconductor substrate. An anti-reflective layer having an absorptive index is then formed overlying the device layer. The anti-reflective layer is an inorganic dielectric material containing silicon and nitrogen. A photoresist layer is then formed overlying the anti-reflective layer. The photoresist layer is then patterned with a selected wavelength of electromagnetic radiation to form an integrated circuit pattern, wherein the absorptive index of the anti-reflective layer is greater than 0.05 at the selected wavelength. Other aspects of the invention involve a device structure useful for making an integrated circuit.

These and other features and advantages will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
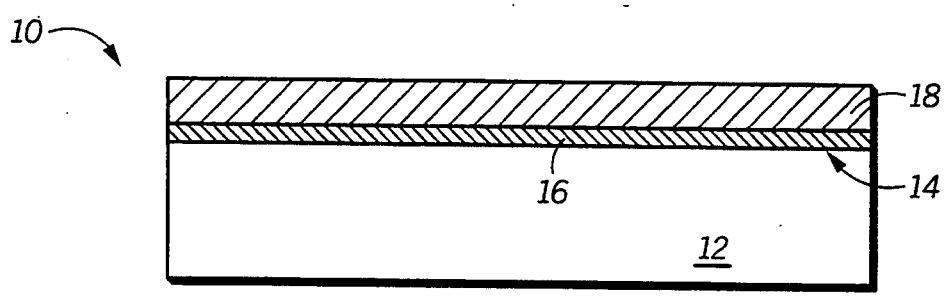
FIGS. 1-3 illustrate, in cross-section, process steps in accordance with one embodiment of the invention.
Figure 2:
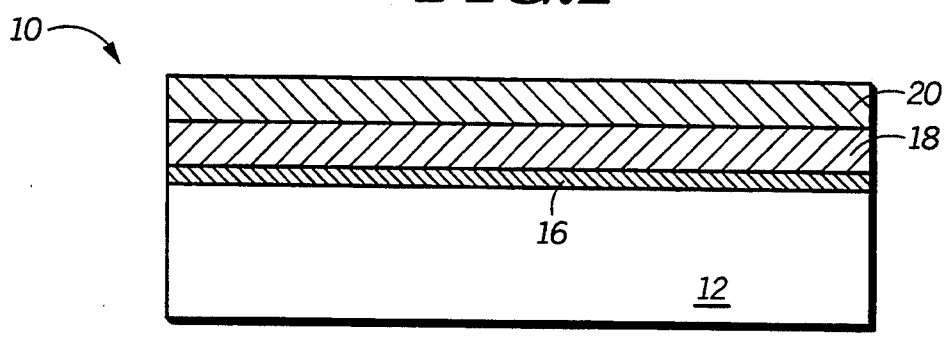
Figure 3:
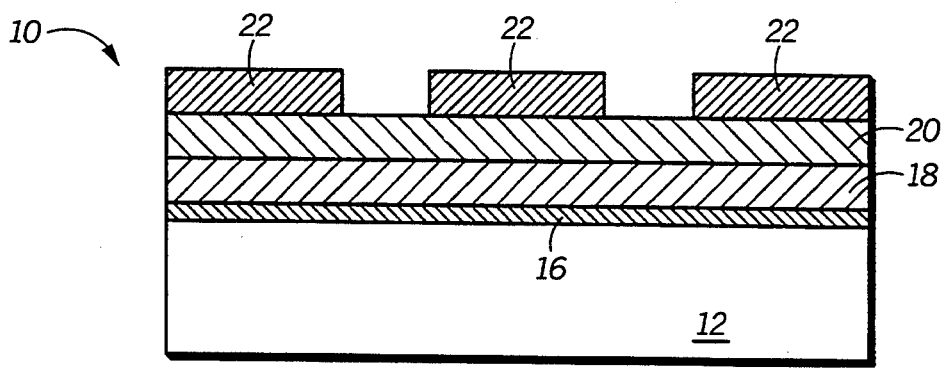

FIGS. 1 through 3 illustrate, in cross-section, process steps in accordance with one embodiment of the invention, wherein an integrated circuit pattern is formed on a semiconductor substrate. Shown in FIG. 1 is a portion 10 of an integrated circuit structure comprising a semiconductor substrate 12, a dielectric layer 16 that overlies the major surface 14 of semiconductor substrate 12, and a device layer 18 that overlies dielectric layer 16. Semiconductor substrate 12 may be a single crystal silicon substrate, a silicon on insulator (SOI) substrate, a silicon on sapphire (SOS) substrate, a gallium arsenide substrate, or the like. Dielectric layer 16 may be thermally grown silicon dioxide, doped silicon dioxide, undoped silicon dioxide, oxynitride, silicon nitride, or the like, and may be formed using conventional deposition or oxidation techniques. Device layer 18 is formed overlying semiconductor substrate 12 using conventional deposition techniques such as sputtering, chemical vapor deposition, or plasma deposition, et cetera. In addition, in some applications dielectric layer 16 may be optional and then device layer 18 may be formed directly on major surface 14. Device layer 18 is preferably a conductive material such as polysilicon, tungsten, tungsten silicide, titanium silicide, or cobalt silicide. Alternatively, device layer 18 may also be an aluminum, an aluminum alloy, or a composite layer comprising a metal silicide layer overlying a polysilicon layer.

In FIG. 2, an inorganic dielectric material containing silicon and nitrogen is then deposited on device layer 18 to form an anti-reflective layer 20. Anti-reflective layer 20 reduces the reflectivity of underlying device layer 18 and has an absorptive index (k), which is dependent upon the exposure wavelength ($\lambda$) used in the subsequent photoresist patterning process. The absorptive index (k), as defined herein, is the imaginary part of the index of refraction. For a selected exposure wavelength anti-reflective layer 20 has an absorptive index that is greater than 0.05, and preferably has an absorptive index of greater than 0.25. Anti-reflective layer 20 also has a thickness (t) which is greater than 5 nanometers. Optimal thicknesses for anti-reflective layer 20 may also be approximated by the following equation:

$$t = (2m+1)\lambda/4n$$

wherein:
  t = thickness of the anti-reflective layer
  $\lambda$ = exposure wavelength
  n = index of refraction for the anti-reflective layer at $\lambda$
  m = 0 or a positive integer such as 1, 2, 3, et cetera Thus both the absorptive index and the thickness of anti-reflective layer 20 may be used to reduce the reflectivity of underlying device layer 18. Anti-reflective layer 20 is preferably a silicon-rich silicon nitride film, which is chemically vapor deposited using ammonia ($NH_3$) and dichlorosilane ($SiCl_2H_2$). Using an ammonia (17 sccm) to dichlorosilane (100 sccm) flow ratio of approximately 1 to 6, a deposition temperature of approximately 720 degrees Celsius, and a deposition pressure of approximately 300 millitorr a silicon-rich silicon nitride film can be deposited with an absorptive index of greater than 0.05. In addition, silicon-rich silicon nitride films having an acceptable absorptive index may also be deposited using other deposition conditions and deposition gases such as silane ($SiH_4$). Moreover, silicon-rich silicon nitride films with an acceptable absorptive index may be deposited using a plasma process as well. For example, a plasma deposition process may be used to form a layer of silicon-rich silicon nitride overlying an aluminum or aluminum alloy layer. As previously mentioned, both the absorptive index and the thickness of anti-reflective layer 20 may be used to minimize the reflectivity of an underlying material. For example at an exposure wavelength of 248 nanometers approximately 500 angstroms of silicon-rich silicon nitride having an adsorptive index of approximately 0.34 reduces the reflectivity of underlying materials such as polysilicon and tungsten polycide to less than 15 percent at the bottom surface of the photoresist layer. Moreover, at an exposure wavelength of 248 nanometers approximately 250 angstroms of silicon-rich silicon nitride having an absorptive index of approximately 0.34 reduces the reflectivity of underlying materials such as polysilicon and tungsten polycide to less than 5 percent at the bottom surface of the photoresist layer.

In FIG. 3 a photoresist layer is then formed overlying the anti-reflective layer 20. The photoresist layer is preferably deposited using conventional spin-coating techniques. Alternatively, other techniques may also be used to deposit the photoresist layer. After deposition, the photoresist layer is then patterned using conventional photolithographic techniques and this results in the formation of integrated circuit pattern 22. Integrated circuit pattern 22 is preferably formed using electromagnetic radiation having an exposure wavelength of less than 440 nanometers, such as 436, 365 or 248 nanometers. After its formation, integrated circuit pattern 22 is then used as a mask during the fabrication of integrated circuits. For example, integrated circuit pattern 22 may be used as an etch mask in order to pattern anti-reflective layer 20 and device layer 18. In addition, integrated circuit pattern 22 may also be used as an ion implantation mask.

Figure 4:
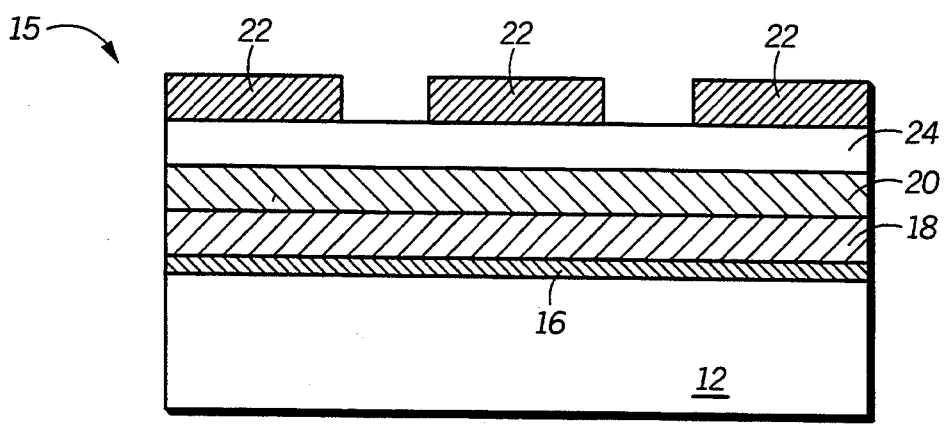
FIG. 4 illustrates, in cross-section, a process step in accordance with an alternative embodiment of the invention.

FIG. 4 illustrates in cross-section an alternative embodiment of the invention. Shown in FIG. 4 is a portion 15 of an integrated circuit structure wherein an insulting layer 24 is formed overlying anti-reflective layer 20 prior to the formation of integrated circuit pattern 20. Insulating layer 24 may be doped silicon dioxide, undoped silicon dioxide, or the like, and may be formed using conventional deposition or oxidation techniques.

Figure 5:
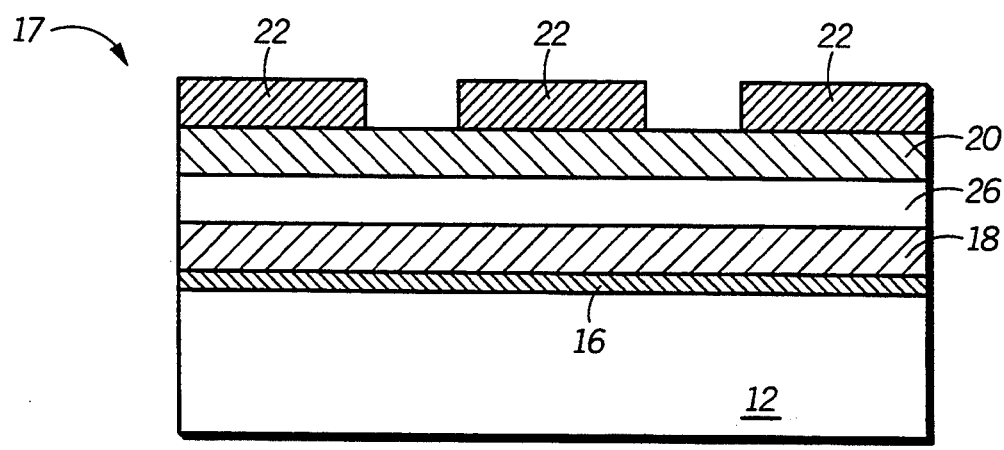
FIG. 5 illustrates, in cross-section, a process step in accordance with another alternative embodiment of the invention.

FIG. 5 illustrates in cross-section another alternative embodiment of the invention. Shown in FIG. 5 is a portion 17 of an integrated circuit structure wherein an insulting layer 26 is formed overlying device layer 18 prior to the formation of anti-reflective layer 20. Insulating layer 26 may be thermally grown silicon dioxide, doped silicon dioxide, undoped silicon dioxide, or the like, and may be formed using conventional deposition or oxidation techniques.

The foregoing description and illustrations contained herein demonstrate many of the advantages associated with the present invention. In particular, an anti-reflective layer containing silicon and nitrogen may be used to photolithographically pattern integrated circuits. More specifically, silicon-rich silicon nitride may be used to reduce the reflectivity of underlying materials such as polysilicon, metals, and metal silicides to less than 5 percent. Moreover, the increased absorptivity of silicon-rich silicon nitride allows it to be effectively used as an anti-reflective layer at short exposure wavelengths, such as 248 nanometers. Therefore, silicon-rich silicon nitride may be used to reduced pattern distortion or "reflective notching" in submicron photoresist patterns that are generated using ultraviolet and deep ultraviolet exposure wavelengths, and thus it is compatible with submicron photolithographic patterning processes. Additionally, silicon-rich silicon nitride is nonconducting, and therefore it does not have to be removed with an additional processing step. In addition, silicon-rich silicon nitride can be etched using conventional etch techniques. Therefore, silicon-rich silicon nitride anti-reflective layers are compatible with existing semiconductor fabrication processes. Furthermore, silicon-rich silicon nitride deposited by chemical vapor deposition also has a low hydrogen content. Therefore, it is compatible with the formation of submicron transistors, which are known to be adversely effected by films containing a high concentration of hydrogen. In addition, chemically vapor deposited silicon-rich silicon nitride is conformal and can be deposited with a thickness uniformity of less than 10 percent across a semiconductor substrate. Therefore, this allows photoresist patterns with a minimum of "reflective notching" or pattern distortion to be uniformly generated across a semiconductor substrate.

Thus it is apparent that there has been provided, in accordance with the invention, a method for forming an integrated circuit pattern on a semiconductor substrate that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, an ammonia to dichlorosilane flow ratio other than 1 to 6 may also be used to form silicon-rich silicon nitride films with an acceptable absorptive index. Therefore, it is not intended that the invention be in any way limited to the specific deposition conditions recited. In addition, the invention is not limited to the use of ammonia and dichlorosilane. Other deposition gases could also be used to form silicon-rich silicon nitride films. It is also important to note that the present invention is not limited in any way to chemically vapor deposited silicon-rich silicon nitride films. These films may also be deposited using plasma deposition processes. Furthermore, although specific exposure wavelengths such as 436, 365, and 248 nanometers have been mentioned, it is not intended that the invention be limited to these exposure wavelengths. Therefore, it is intended that this invention encompass all such variations and modifications as fall within the scope of the appended claims.

We claim:

1. A method for forming an integrated circuit pattern on a semiconductor substrate comprising the steps of:
   providing the semiconductor substrate, the semiconductor substrate having a major surface;
   forming a device layer overlying the major surface of the semiconductor substrate;
   forming an anti-reflective layer having an absorptive index overlying the device layer, wherein the anti-reflective layer is an inorganic dielectric material containing silicon and nitrogen;
   forming a photoresist layer overlying the anti-reflective layer; and
   exposing a portion of the photoresist layer to electromagnetic radiation to form the integrated circuit pattern, wherein the electromagnetic radiation has an exposure wavelength and the absorptive index of the anti-reflective layer is greater than 0.05 at the exposure wavelength.

2. The method of claim 1, wherein the step of forming the anti-reflective layer comprises:
   forming a layer of silicon-rich silicon nitride.

3. The method of claim 2, wherein the step of forming the layer of silicon-rich silicon nitride comprises:
   forming the layer of silicon-rich silicon nitride by chemical vapor deposition.

4. The method of claim 1, wherein the step of forming the anti-reflective layer comprises:
   forming the anti-reflective layer with a thickness greater than 5 nanometers.

5. The method of claim 1, wherein the step of forming the anti-reflective layer comprises:
   depositing the anti-reflective layer using a plasma.

6. The method of claim 5, wherein the step of forming the device layer comprises:
   forming a layer containing aluminum.

7. The method of claim 1, wherein the step of forming the anti-reflective layer comprises:
   forming the anti-reflective layer by chemical vapor deposition.

8. The method of claim 1, wherein the step of forming the device layer comprises:
   forming a conductive layer.

9. The method of claim 8, wherein the step of forming the conductive layer comprises:
   forming a composite layer comprising a silicide layer overlying a polysilicon layer.

10. The method of claim 8, wherein the step of forming the conductive layer comprises:
    forming a layer of polysilicon.

11. The method of claim 1, wherein the step of exposing the exposure wavelength is less than 440 nanometers.

12. The method of claim 11, wherein the step of forming the anti-reflective layer comprises:
    forming the anti-reflective layer having a refractive index and a thickness, wherein the thickness is approximated by the equation $t=\lambda/4n$, where $t$ is the thickness of the anti-reflective layer, $\lambda$ is the exposure wavelength of the electromagnetic radiation, and $n$ is the refractive index of the anti-reflective layer.

13. The method of claim 11, wherein the step of exposing the absorptive index of the anti-reflective layer is greater than 0.25 at the exposure wavelength.

14. The method of claim 1, wherein the step of exposing the exposure wavelength is 248 nanometers.

15. The method of claim 1 further comprising the step of:
    forming an insulating layer, wherein the insulating layer overlies the anti-reflective layer and underlies the photoresist layer.

16. The method of claim 1 further comprising the step of:
    forming an insulating layer, wherein the insulating layer overlies the device layer and underlies the anti-reflective layer.

17. A method for forming an integrated circuit pattern on a semiconductor substrate comprising the steps of:
    providing the semiconductor substrate, the semiconductor substrate having a major surface;
    forming a device layer overlying the major surface of the semiconductor substrate;
    forming an anti-reflective layer of silicon-rich silicon nitride overlying the device layer, the anti-reflective layer having an absorptive index;
    forming a photoresist layer overlying the layer of silicon-rich silicon nitride; and
    exposing a portion of the photoresist layer to electromagnetic radiation to form the integrated circuit pattern, wherein the electromagnetic radiation has an exposure wavelength and the absorptive index of the anti-reflective layer is greater than 0.05 at the exposure wavelength.

18. The method of claim 17, wherein the step of forming the device layer comprises:
    forming a conductive layer.

19. The method of claim 18, wherein the step of forming the conductive layer comprises:
    forming a layer containing aluminum.

20. The method of claim 18, wherein the step of forming the conductive layer comprises:
    forming a composite layer comprising a silicide layer overlying a polysilicon layer.

21. The method of claim 18, wherein the step of forming the conductive layer comprises:
    forming a layer of polysilicon.

22. The method of claim 17, wherein the step of exposing the exposure wavelength is less than 440 nanometers.

23. The method of claim 22, wherein the step of forming the anti-reflective layer comprises:
    forming the anti-reflective layer having a refractive index and a thickness, wherein the thickness is approximated by the equation $t=\lambda/4n$, where $t$ is the thickness of the anti-reflective layer, $\lambda$ is the exposure wavelength of the electromagnetic radiation, and $n$ is the refractive index of the anti-reflective layer.

24. The method of claim 22, wherein the step of exposing the absorptive index of the anti-reflective layer is greater than 0.25 at the exposure wavelength.

25. The method of claim 17, wherein the step of exposing the exposure wavelength is 248 nanometers.

26. The method of claim 17, wherein the step of forming the anti-reflective layer comprises:
    forming the anti-reflective layer with a thickness greater than 5 nanometers.

27. A method for forming an integrated circuit pattern on a semiconductor substrate comprising the steps of:
    providing the semiconductor substrate, the semiconductor substrate having a major surface;
    forming a polysilicon layer overlying the major surface of the semiconductor substrate;

forming an anti-reflective layer of silicon-rich silicon nitride overlying the polysilicon layer, the anti-reflective layer having an absorptive index;

forming a photoresist layer overlying the anti-reflective layer; and exposing a portion of the photoresist layer to electromagnetic radiation to form the integrated circuit pattern, wherein the electromagnetic radiation has an exposure wavelength and the absorptive index of the anti-reflective layer is greater than 0.05 at the exposure wavelength.

28. The method of claim 27, wherein the step of forming the anti-reflective layer comprises:

forming the anti-reflective layer by chemical vapor deposition.

29. The method of claim 27, wherein the step of exposing the exposure wavelength is less than 440 nanometers.

30. The method of claim 29, wherein the step of forming the anti-reflective layer comprises:

forming the anti-reflective layer having a refractive index and a thickness, wherein the thickness is approximated by the equation $t = \lambda/4n$, where t is the thickness of the anti-reflective layer, $\lambda$ is the exposure wavelength of the electromagnetic radiation, and n is the refractive index of the anti-reflective layer.

31. The method of claim 29, wherein the step of exposing the absorptive index of the anti-reflective layer is greater than 0.25 at the exposure wavelength.

32. The method of claim 27, wherein the step of exposing the exposure wavelength is 248 nanometers.

33. The method of claim 27 further comprising the step of:

forming an insulating layer, wherein the insulating layer overlies the anti-reflective layer and underlies the photoresist layer.

34. The method of claim 27, wherein the step of forming the anti-reflective layer comprises:

forming the anti-reflective layer with a thickness greater than 5 nanometers.

* * * * *